(12) United States Patent
Jeong et al.

(10) Patent No.: US 11,948,621 B2
(45) Date of Patent: Apr. 2, 2024

(54) MEMORY DEVICES, MEMORY SYSTEMS HAVING THE SAME, AND OPERATING METHODS THEREOF

(71) Applicant: Samsung Electronics Co., Ltd., Suwon-si (KR)

(72) Inventors: Jaewoo Jeong, Daejeon (KR); Yonghun Kim, Hwaseong-si (KR); Jaemin Choi, Suwon-si (KR); Yoochang Sung, Hwaseong-si (KR); Changsik Yoo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 119 days.

(21) Appl. No.: 17/839,639

(22) Filed: Jun. 14, 2022

(65) Prior Publication Data

US 2023/0035176 A1    Feb. 2, 2023

(30) Foreign Application Priority Data

Jul. 28, 2021   (KR) .................. 10-2021-0099467
Nov. 30, 2021  (KR) .................. 10-2021-0168429
Feb. 23, 2022  (KR) .................. 10-2022-0023402

(51) Int. Cl.
*G11C 11/4076*    (2006.01)

(52) U.S. Cl.
CPC ............................ *G11C 11/4076* (2013.01)

(58) Field of Classification Search
CPC ............... G11C 11/4076; G11C 11/40
USPC ............................................. 365/233.1
See application file for complete search history.

(56) References Cited

U.S. PATENT DOCUMENTS

| | | | |
|---|---|---|---|
| 6,920,540 B2* | 7/2005 | Hampel | G11C 7/1066 713/400 |
| 7,642,827 B2 | 1/2010 | Kwak | |
| 7,840,831 B2 | 11/2010 | Jang | |
| 7,907,693 B2 | 3/2011 | Bae et al. | |
| 7,999,591 B2 | 8/2011 | Kim et al. | |
| 8,072,253 B2* | 12/2011 | Kaeriyama | H03L 7/0998 327/231 |
| 8,138,799 B2 | 3/2012 | Hayashi | |
| 8,324,949 B2 | 12/2012 | Cherkassky et al. | |
| 9,563,597 B2* | 2/2017 | Ware | G06F 13/161 |

(Continued)

FOREIGN PATENT DOCUMENTS

| | | |
|---|---|---|
| KR | 20050115703 A | 12/2005 |
| KR | 20060057712 A | 5/2006 |

(Continued)

OTHER PUBLICATIONS

"Office Action with Search Report", TW Application No. 111128170, dated May 4, 2023, 3 pp.

*Primary Examiner* — Muna A Techane
(74) *Attorney, Agent, or Firm* — Myers Bigel, P.A.

(57) ABSTRACT

A memory device includes a first rank having first memory banks and a first quad skew adjustment circuit and a second rank having second memory banks and a second quad skew adjustment circuit, wherein each of the first quad skew adjustment circuit and the second quad skew adjustment circuit is configured to: receive a 4-phase clock through first channels; detect internal quad skew of the 4-phase clock; correct skew of the 4-phase clock according to the detected quad skew; and output mode register information corresponding to the detected quad skew through a second channel.

20 Claims, 14 Drawing Sheets

(56) References Cited

U.S. PATENT DOCUMENTS

| | | | |
|---|---|---|---|
| 10,135,429 B2 | 11/2018 | Adachi | |
| 10,680,592 B2 | 6/2020 | Zhao et al. | |
| 10,841,072 B2 | 11/2020 | Huang et al. | |
| 11,005,479 B2 | 5/2021 | Im et al. | |
| 11,121,716 B2 | 9/2021 | Shin et al. | |
| 11,145,341 B2 | 10/2021 | Kim | |
| 11,525,854 B2 * | 12/2022 | Lee .................. | G01R 29/26 |
| 2010/0039157 A1 | 2/2010 | Kaeriyama et al. | |
| 2020/0162066 A1 | 5/2020 | Gans | |
| 2021/0358534 A1 | 11/2021 | Choi et al. | |

FOREIGN PATENT DOCUMENTS

| | | |
|---|---|---|
| KR | 20070121465 A | 12/2007 |
| KR | 20090072117 A | 7/2009 |
| KR | 20210078572 A | 6/2021 |
| TW | 200809460 A | 2/2008 |
| TW | I459179 B | 11/2014 |

* cited by examiner

MEMORY DEVICES, MEMORY SYSTEMS HAVING THE SAME, AND OPERATING METHODS THEREOF

CROSS-REFERENCE TO RELATED APPLICATION(S)

This application claims the benefit of priority to Korean Patent Application Nos. 10-2021-0099467, filed on Jul. 28, 2021 in the Korean Intellectual Property Office, 10-2021-0168429, filed on Nov. 30, 2021 in the Korean Intellectual Property Office and 10-2022-0023402, filed on Feb. 23, 2022 in the Korean Intellectual Property Office, the disclosures of which are incorporated herein by reference in their entirety.

BACKGROUND

The present disclosure relates to memory devices. A mobile-oriented semiconductor memory device such as a low power double data rate synchronous dynamic random-access memory (LPDDR SDRAM), a dynamic random access memory (DRAM), and the like, may be used in mobile electronic devices. When an application processor (AP) is mounted in a mobile electronic device as one of multiple cores, a semiconductor memory device such as an LPDDR, a DRAM, and the like, may be utilized as a working memory of the AP.

SUMMARY

An aspect of the present inventive concept is to provide a memory system that efficiently manages quad skew, and an operating method thereof.

According to an aspect of the present inventive concept, a memory device may include: a first rank having first memory banks and a first quad skew adjustment circuit; and a second rank having second memory banks and a second quad skew adjustment circuit, wherein each of the first quad skew adjustment circuit and the second quad skew adjustment circuit is configured to: receive a 4-phase clock through first channels; detect internal quad skew of the 4-phase clock; correct skew of the 4-phase clock according to the detected quad skew; and output mode register information corresponding to the detected quad skew through a second channel.

According to an aspect of the present inventive concept, an operating method of a system including a multi-rank memory device and a controller configured to control the multi-rank memory device may include operations of: detecting internal quad skew of a 4-phase clock received through first channels from the controller by a plurality of ranks of the multi-rank memory device; correcting, by the ranks, first skew of the 4-phase clock according to the detected internal quad skew; and adjusting, by the controller, second skew of the 4-phase clock using mode register information that corresponds to the internal quad skew and is received through a second channel from the ranks by the controller.

According to an aspect of the present inventive concept, a memory system may include: a memory device adjusting first quad skew of a 4-phase clock; and a controller for controlling the memory device, and controlling second quad skew of the 4-phase clock, wherein the memory device includes a first rank receiving the 4-phase clock from the controller through first channels, detecting first internal quad skew of the 4-phase clock, storing first mode register information corresponding to the first internal quad skew, and outputting the first mode register information to the controller through a second channel; and a second rank receiving the 4-phase clock through the first channels, detecting second internal quad skew of the 4-phase clock, storing second mode register information corresponding to the second internal quad skew, and outputting the second mode register information to the controller through the second channel.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, example embodiments of the present inventive concept will be described in detail with reference to the accompanying drawings to allow those skilled in the art to gain a thorough and comprehensive understanding of the present inventive concept.

A memory system and an operating method thereof according to an example embodiment of the present inventive concept may detect and adjust quad skew as a multi-rank system for supporting a 4-phase clock. In particular, in the memory system and the operating method thereof according to the present inventive concept, efficient skew adjustment may be performed, by adjusting the quad skew internally and externally of the memory device.

Figure 1:
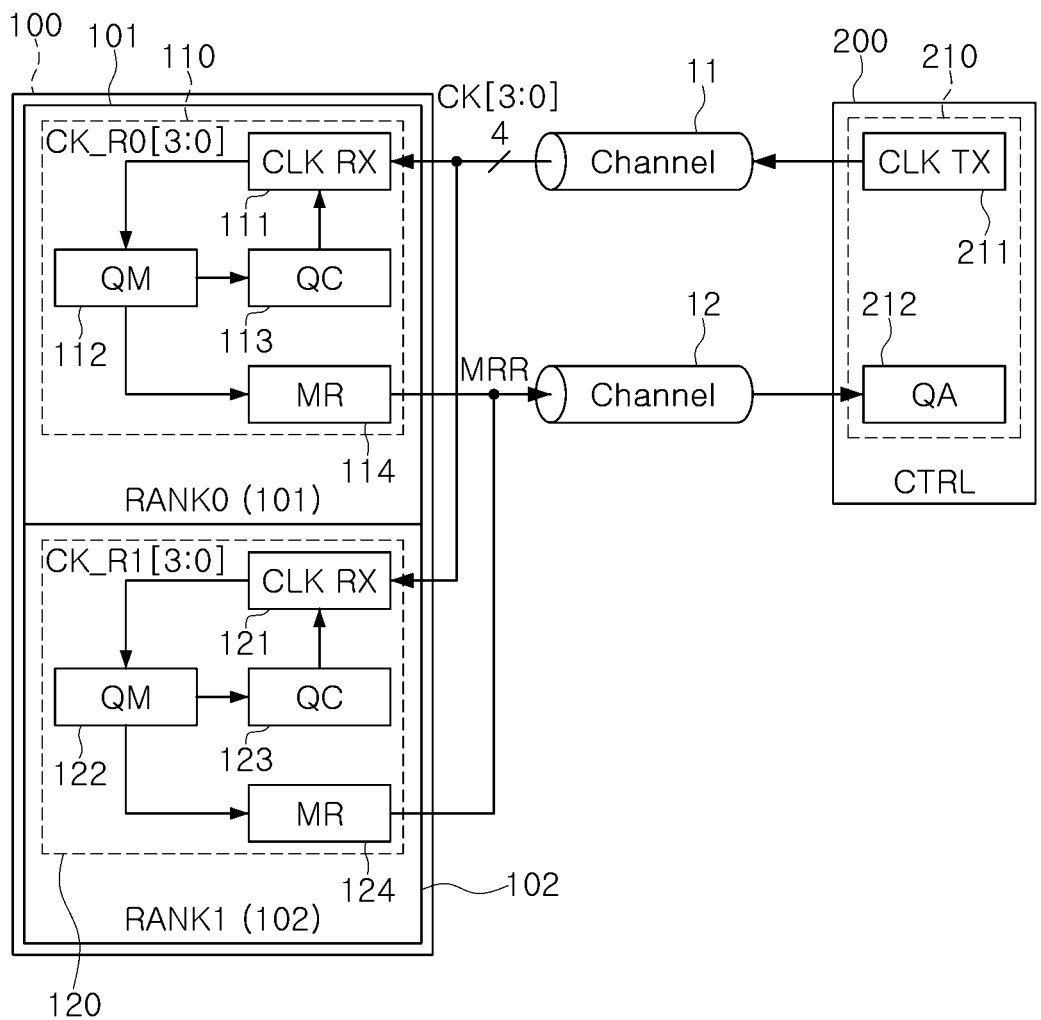
FIG. 1 is a diagram illustrating a memory system according to an example embodiment of the present inventive concept.

FIG. 1 is a diagram illustrating a memory system according to an example embodiment of the present inventive concept. Referring to FIG. 1, a memory system 10 may include a memory device 100 and a memory controller 200 (CTRL).

The memory system 10 may be implemented to be included in a personal computer (PC) or a mobile electronic device. The mobile electronic device may be implemented as a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or a portable navigation device (PND), a handheld game console, a mobile internet device (MID), a wearable computer, an internet of things (IoT) device, an internet of everything (IoE) device, or a drone.

The memory device 100 may be implemented as a volatile memory device. The volatile memory device may be implemented as a random access memory (RAM), a dynamic RAM (DRAM), a static RAM (SRAM), or a low power double data rate (LPDDR) DRAM. In another embodiment, the memory device 100 may be implemented as a non-volatile memory device. The non-volatile memory device may be implemented as electrically erasable programmable read-only memory (EPROM), NOR flash memory, NAND flash memory, magnetoresistive random access memory (MRAM), spin transfer torque (STT)-MRAM, ferroelectric RAM (FeRAM), phase change RAM (PRAM), resistive RAM (RRAM), nanotube RAM/RRAM, polymer RAM (PoRAM)), nano floating gate memory (NFGM), holographic memory, a molecular electronic memory device, or an insulator resistance change memory.

In addition, the memory device 100 may be implemented as a multi-rank having a plurality of ranks. Here, the rank refers to one block or region of data generated by using a part or all of a memory chip in one module. In an example embodiment, one rank may input/output 64-bit or 72-bit data. In FIG. 1, two ranks are illustrated for convenience of description.

The memory device 100 may include a first rank 101 and a second rank 102. In an example embodiment, the first rank 101 and the second rank 102 may receive a 4-phase clock CK[3:0] from a controller 200 through first channels 11. For example, the four clocks CK[0], CK[1], CK[2], and CK[3] of the 4-phase clock CK[3:0] may be received through four of the first channels 11, respectively. In an example embodiment, the first rank 101 and the second rank 102 may output mode register information MRR to the controller 200 through a second channel 12. As an example, the first rank 101 and the second rank 102 may output first mode register information MRR and second mode register information MRR, respectively, to the controller 200 through the second channel 12. The first mode register information MRR may correspond to first internal quad skew that is detected by the first rank 101, and the second mode register information MRR may correspond to second internal quad skew that is detected by the second rank 102. Here, the second channel 12 may be any one of a command/address bus and a data bus.

The first rank 101 may include a plurality of first memory banks and a first quad skew adjustment circuit 110. Each of the first memory banks may include a plurality of memory cells connected between word lines and bit lines. The first quad skew adjustment circuit 110 may include a clock receiver (CLK RX) 111, a quad skew monitor (QM) 112, a quad skew corrector (QC) 113, and a mode register (MR) 114. The clock receiver (CLK RX) 111 may be implemented to receive a 4-phase clock CK[3:0] through the first channels 11, and output a first bank 4-phase clock CK_R0[3:0]. The quad skew monitor 112 and QM may be implemented to receive the first bank 4-phase clock CK_R0[3:0] from the clock receiver 111 and monitor the quad skew. The quad skew corrector (QC) 113 may be implemented to adjust the skew of the first bank 4-phase clock (CK_R0[3:0]) output from the clock receiver 111 in response to the monitoring result of the quad skew monitor 112. The mode register (MR) 114 may be implemented to store information MRR corresponding to a monitoring result of the quad skew monitor 112. Here, the mode register information MRR stored in the mode register 114 may be output through the second channel 12 at the request of the controller 200.

The second rank 102 may include a plurality of second memory banks and a second quad skew adjustment circuit 120. The second quad skew adjustment circuit 120 may include a clock receiver (CLK RX) 121, a quad skew monitor (QM) 122, a quad skew corrector 123, and a mode register (MR) 124. The clock receiver 121 may receive the 4-phase clock CK[3:0] through the first channels 11, and may output a second bank 4-phase clock CK_R1[3:0]. Each of the clock receiver (CLK RX) 121, the quad skew monitor (QM) 122, the quad skew corrector (QC) 123, and the mode register (MR) 124 may be implemented in the same manner as the clock receiver 111, quad skew monitor 112, quad skew corrector 113, and mode register 114, respectively, of the first rank 101.

The memory controller 200 may be implemented as an integrated circuit, a system on a chip (SoC), an application processor (AP), a mobile AP, a chipset, or a combination of chips. The memory controller 200 may include a random access memory (RAM), a central processing unit (CPU), a graphics processing unit (GPU), a neural network processing unit (NPU), or a modem. In an example embodiment, the memory controller 200 may perform a function of a modem and a function of an AP.

The memory controller 200 may be implemented to control the memory device 100 to read data stored in the memory device 100 or write data to the memory device 100. The memory controller 200 may provide a command CMD (FIG. 10) and an address ADD (FIG. 10) to the memory device 100 in synchronization with the 4-phase clock CK[3:0], thereby controlling a write operation or a read operation for the memory device 100. In addition, the DQ (FIG. 2) may be transmitted and received between the memory controller 200 and the memory device 100 in synchronization with a data transmission clock.

The memory controller 200 may include a quad skew control circuit 210 for controlling quad skew of the memory device 100. The quad skew control circuit 210 may be implemented to output the 4-phase clock (CK[3:0]) to the memory device 100, receive mode register information MRR corresponding to the quad skew monitoring result from the memory device 100, and adjust skew of the 4-phase clock CK[3:0] in response to the mode register information MRR.

The quad skew control circuit 210 may include a clock transmitter 211 and a quad skew adjuster (QA) 212. The clock transmitter 211 may be implemented to output the 4-phase clock (CK[3:0]) to the memory device 100 through the first channels 11. The quad skew controller (QA) 212 may be implemented to read mode register information MRR of the requested rank through the second channel 12, and based on the mode register information MRR, such as based on duty-cycle information and/or whether the mode register information MRR is from the first rank 101 or the second rank 102, adjust the skew of the 4-phase clock (CK[3:0]).

In a conventional memory system, quad skew is detected from inside a memory device, and the detected skew is processed thereinside. On the other hand, the memory system 10 according to an example embodiment may detect quad skew from inside the memory device 100 having a plurality of ranks, and transmit the detected information to an external controller 200. In the memory system 10 according to an example embodiment of the present inventive concept, the common quad skew between ranks 101 and 102 sharing the same clock may be removed by the external controller 200, and additional internal skew (other than the common quad skew) may be processed in the internal quad skew adjustment circuits 110 and 120 of the memory device 100. Accordingly, the memory system 10 implemented as an interface system for transmitting and receiving a 4-phase clock to and from the input/output pins may detect a state of internal quad skew, and compensate for the state internally according to the detection result or externally monitor the same to reduce/minimize the internal quad skew. The memory system 10 according to an example embodiment of the present inventive concept may effectively manage the skew in a multi-rank system.

Figure 2:
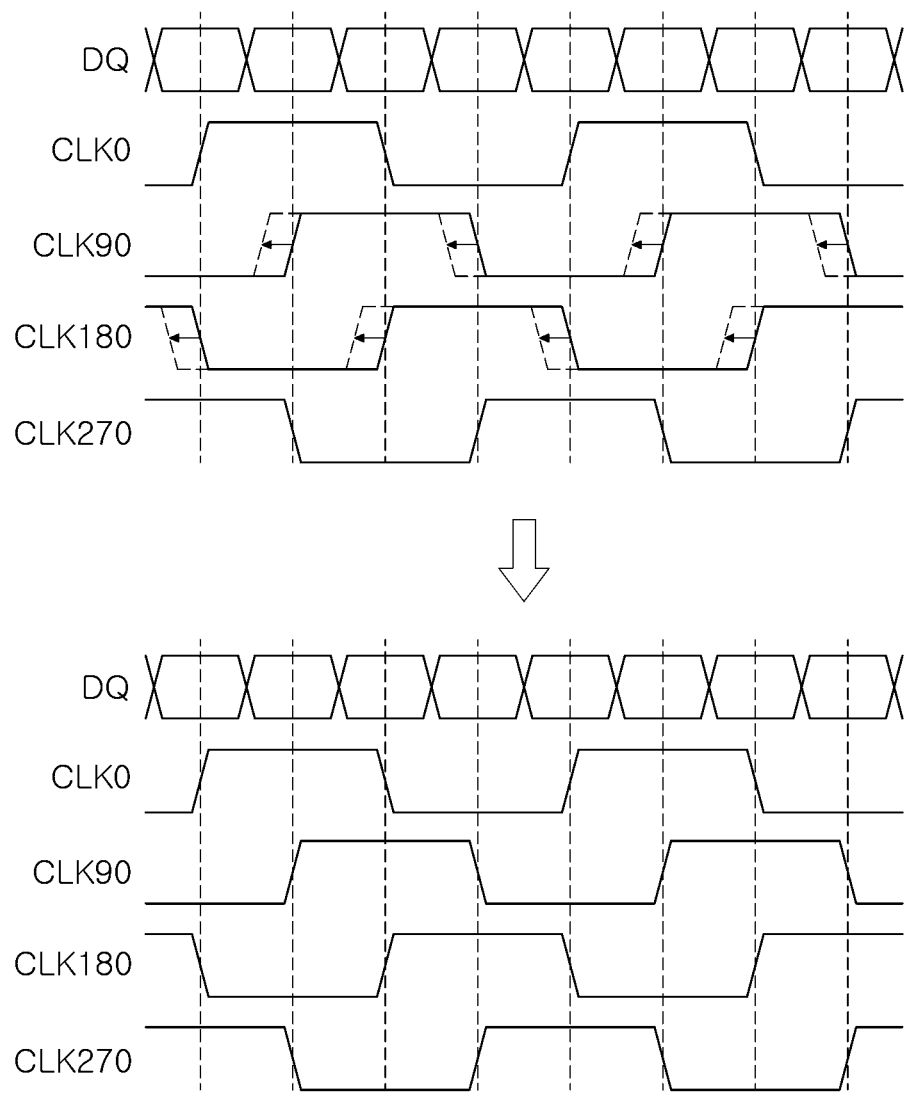
FIG. 2 is a diagram illustrating quad-skew removal of a memory system according to an example embodiment of the present inventive concept.

FIG. 2 is a diagram illustrating quad skew removal of a memory system 10 according to an example embodiment of the present inventive concept.

In general, quad skew reduces a timing margin of a data sampling unit. Here, quad skew means skew between internal 4-phases (CLK0, CLK90, CLK180, CLK270; or CK[0], CK[1], CK[2], CK[3]) in a data interface system transmitted and received through input/output pins. As illustrated in FIG. 2, in the memory system 10 of the present inventive concept, quad skew may be detected inside the memory device 100, all or a part of the detected quad skew may be internally processed, or internal quad skew may be reduced/minimized by monitoring and processing the quad skew in an external controller 200. Accordingly, the memory system 10 may secure as much of a data timing margin as possible.

Meanwhile, in the memory system 10 according to an example embodiment, the quad skew may be removed by using various combinations of an external skew removal method and an internal skew removal method according to the detected quad skew.

Figure 3A:
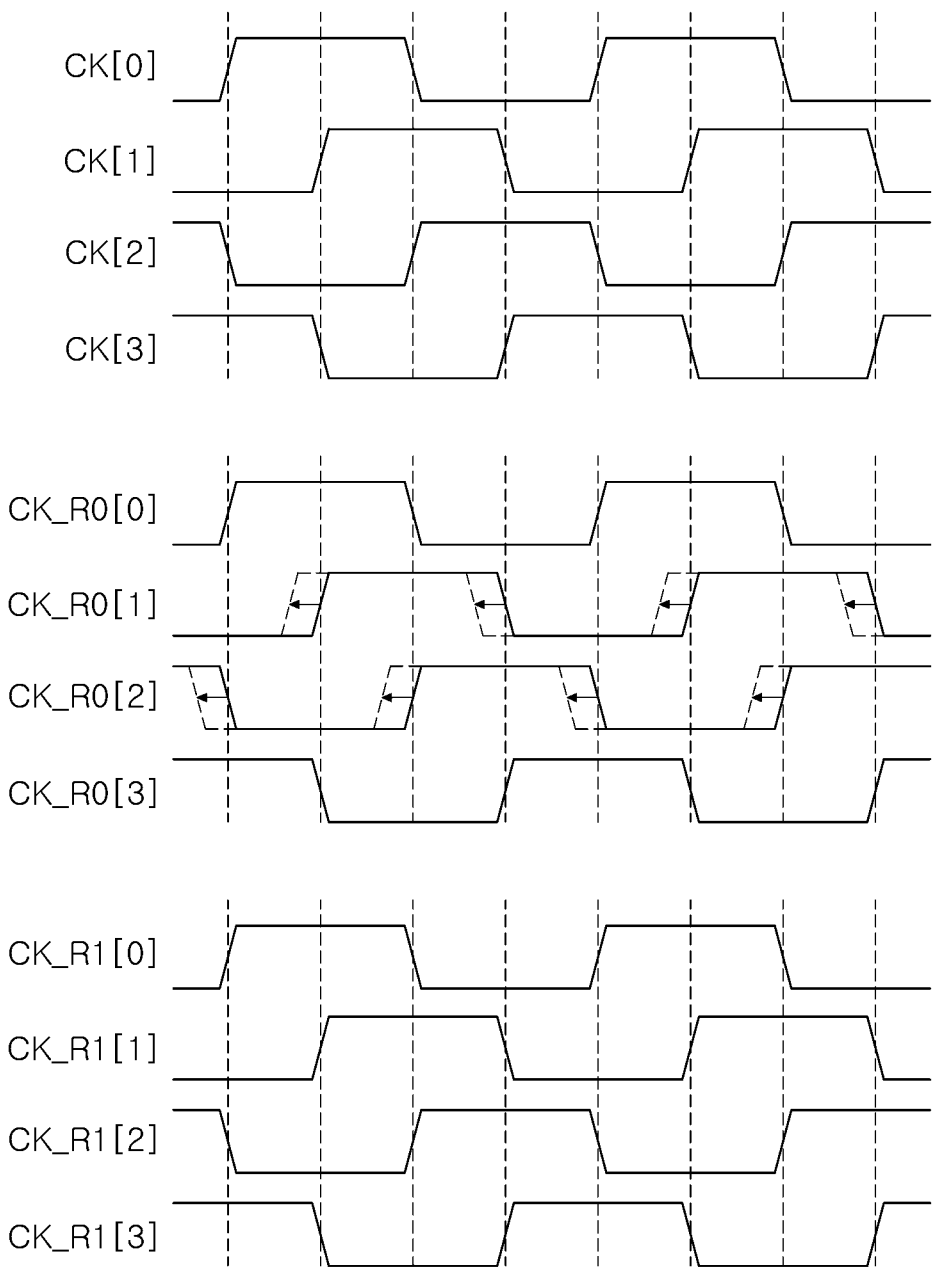
FIGS. 3A, 3B, and 3C are diagrams illustrating a quad-skew method according to quad-skew detection in the memory system according to an example embodiment of the present inventive concept.
Figure 3B:
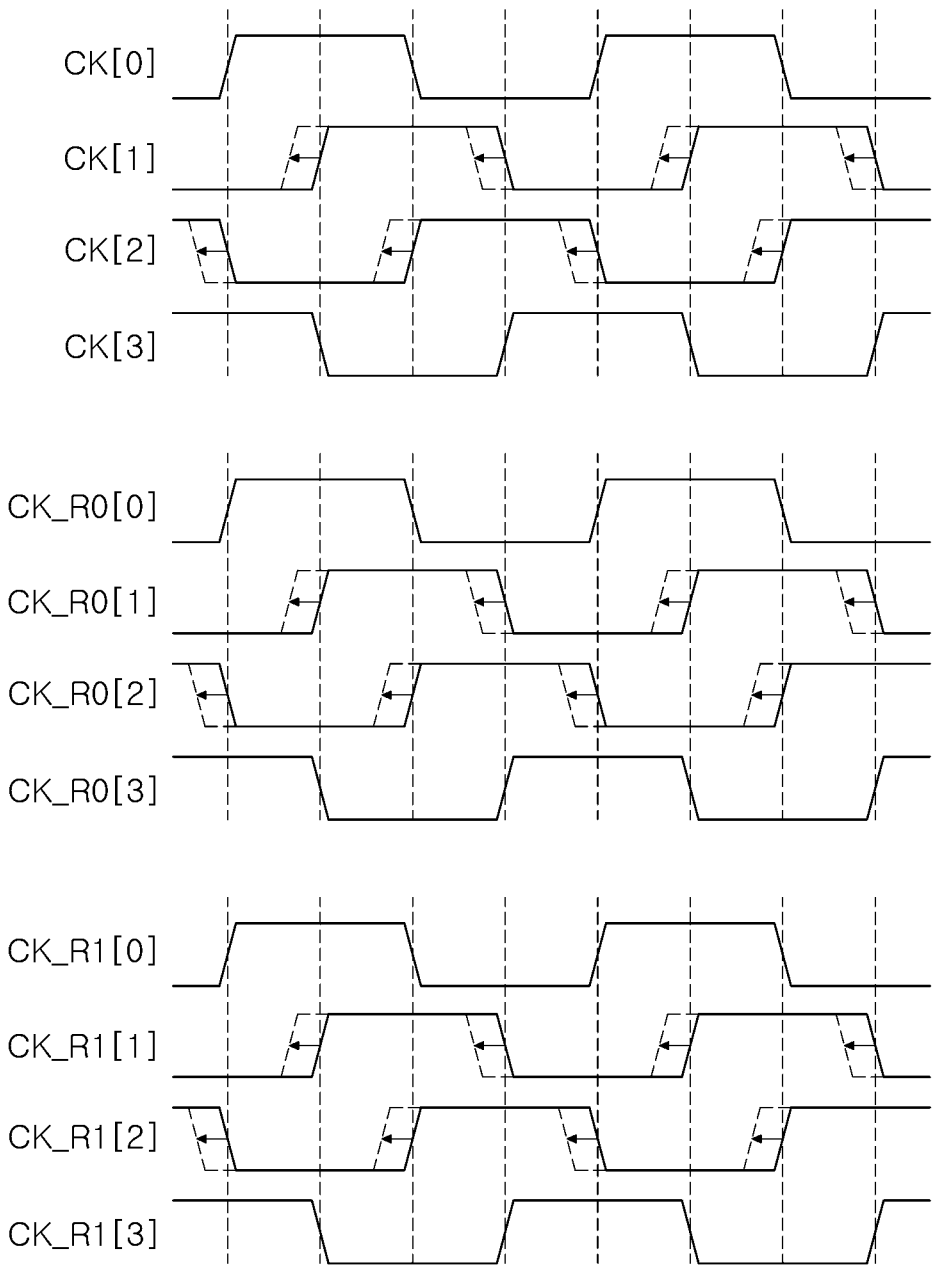
Figure 3C:
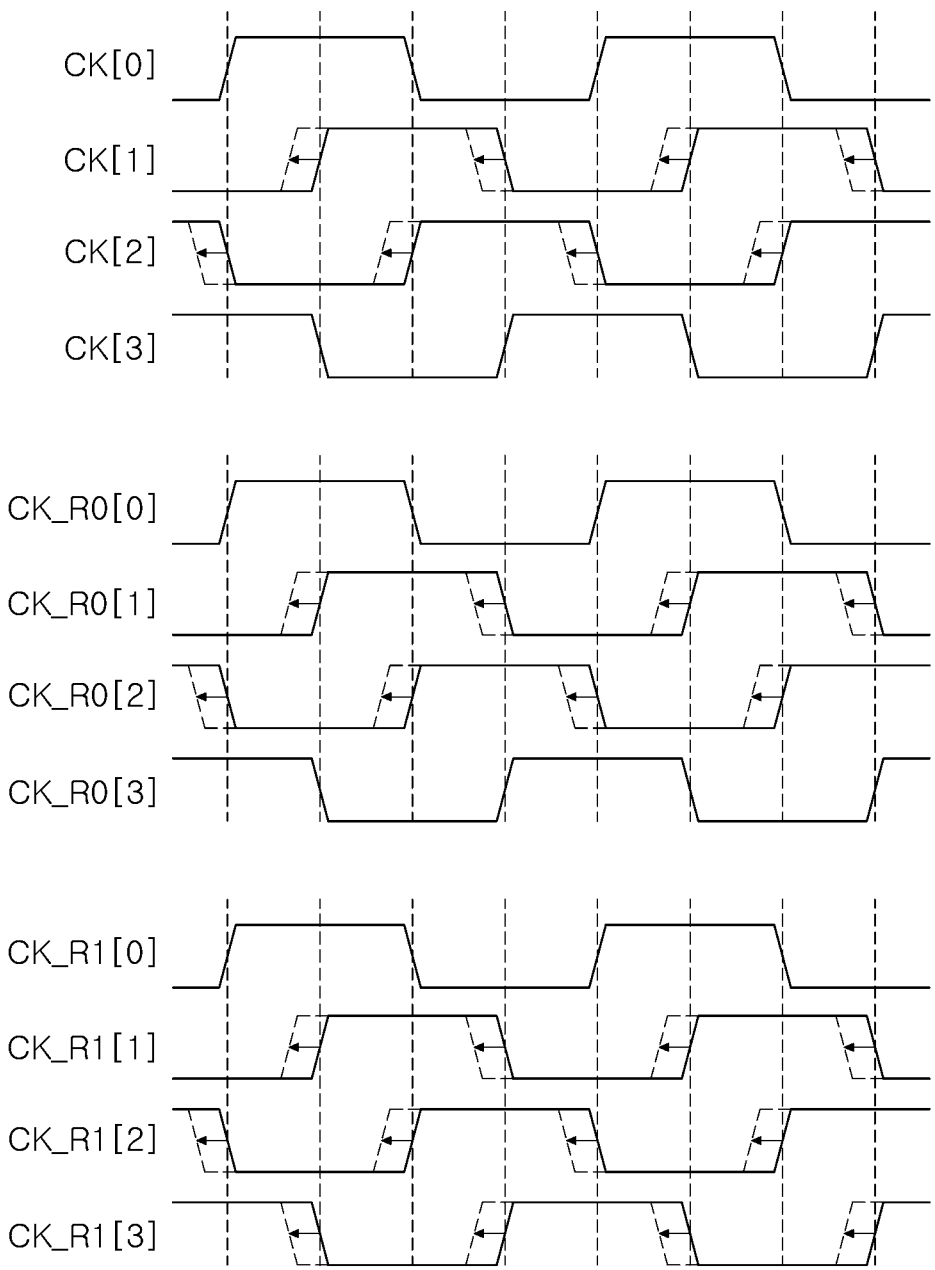

FIGS. 3A, 3B, and 3C are diagrams illustrating a quad-skew method according to quad-skew detection in the memory system 10 according to an example embodiment of the present inventive concept.

Referring to FIG. 3A, a case in which quad skew is generated only in the first rank 101 among the first rank 101 and the second rank 102, is illustrated. For example, as illustrated in FIG. 3A, skew may be generated in clocks CK_R0[1] and CK_R0[2] of the first rank 101. Since the quad skew occurs only inside the memory chip of the first rank 101, the first rank 101 may operate the first quad skew adjustment circuit 110 to remove the internal quad skew.

Referring to FIG. 3B, quad skew may be generated in the same direction in the first rank 101 and the second rank 102. For example, as illustrated in FIG. 3B, skew may be generated in the same direction of the received clocks CK_R1[1] and CK_R1[2], the clocks (CK_R0[1], CK_R0[2]) of the first rank 101, and the clocks (CK_R1[1] and CK_R1[2]) of the second rank 102. When viewed from outside of the memory device 100 (e.g., from the controller 200 illustrated in FIG. 1), it is confirmed that the quad skew of the clocks inside the memory chips of the first rank 101 and the second rank 102 deviate in the same direction. This same-direction skew may commonly remove the CK[0], CK[1], CK[2], and CK[3] by the controller 200 external (SOC side) to a plurality of ranks 101 and 102. Meanwhile, it should be understood that the present inventive concept is not limited thereto. The skew in the same direction may be removed by using respective quad skew adjustment circuits of the ranks 101, 102.

Referring to FIG. 3C, quad skew may be generated in the first rank 101 and the second rank 102, and portions of the skew may be in the same direction. The common quad skew of the ranks 101 and 102 may be processed by the external controller 200. In this case, the controller 200 may transmit a skew-free clock of each of the ranks 101 and 102. The skew-free clock transmitted here may still have internal quad skew. This internal quad skew may be processed by a quad skew adjustment circuit of each of the ranks 101 and 102. According to the skew removal method, the quad skew may be effectively removed at the same time internally and externally of the memory device 100.

Figure 4A:
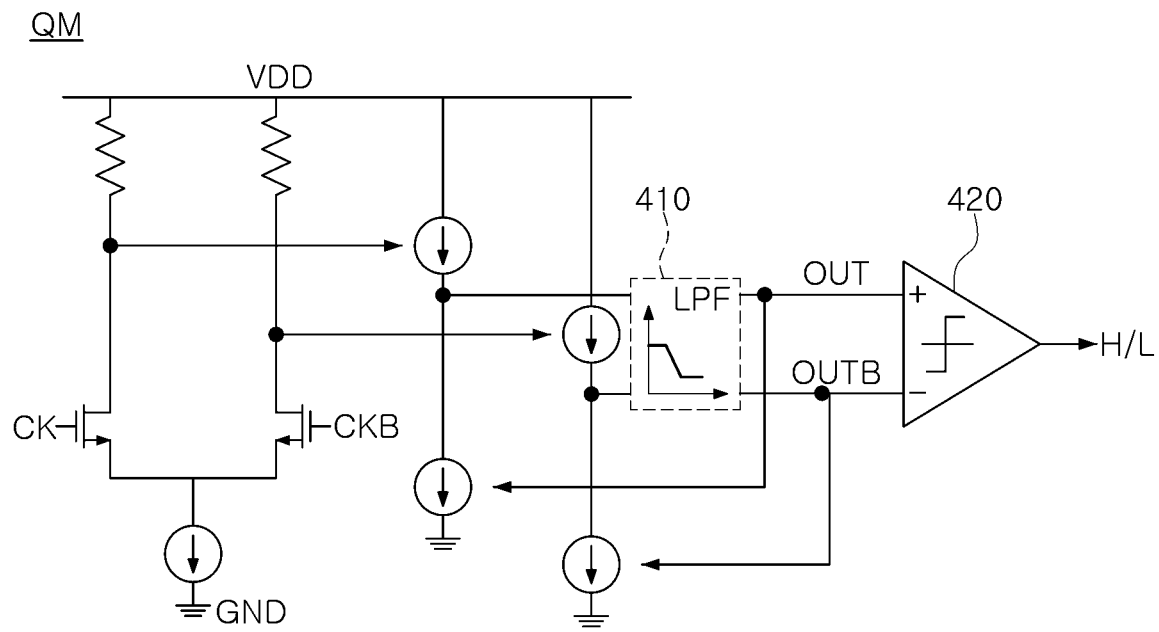
FIGS. 4A and 4B are diagrams illustrating a quad-skew monitor and input clocks thereof.
Figure 4B:
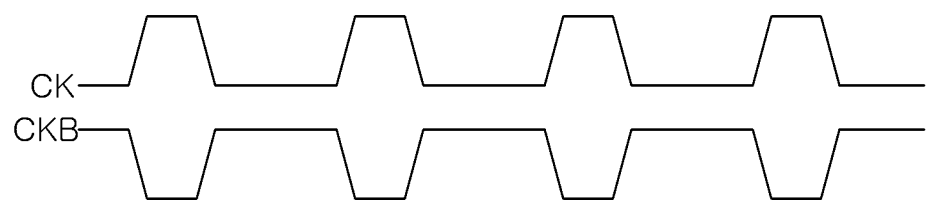

FIGS. 4A and 4B are diagrams illustrating a quad-skew monitor (QM) and input clocks thereof (CK and CKB). Here, the input clocks (CK and CKB) may be clocks having opposite phases generated using edge-to-edge (e.g., edge-to-edge processing) by two of the 4-phase clocks CK[0], CK[1], CK[2], and CK[3]. In an example embodiment, a frequency of each of the input clocks and (CK and CKB) may be twice the frequency of each of the 4-phase clocks CK[0], CK[1], CK[2], and CK[3]. The quad skew monitor QM may accumulate a duty (e.g., a duty cycle) through a charge pump LPF 410 in synchronization with the input clocks CK and CKB, and determines the duty (e.g., a duty cycle) of the newly generated clock through a comparator 420. For example, the comparator 420 may compare signals OUT and OUTB and output high-level information H or low-level information L as a result of the comparison.

Accordingly, the quad-skew monitor QM may detect phase skew between two different phase clocks.

Meanwhile, it should be understood that the quad-skew monitor (QM) of the present inventive concept is not limited thereto. The quad-skew monitor of the present inventive concept can be implemented in various manners.

Figure 5:
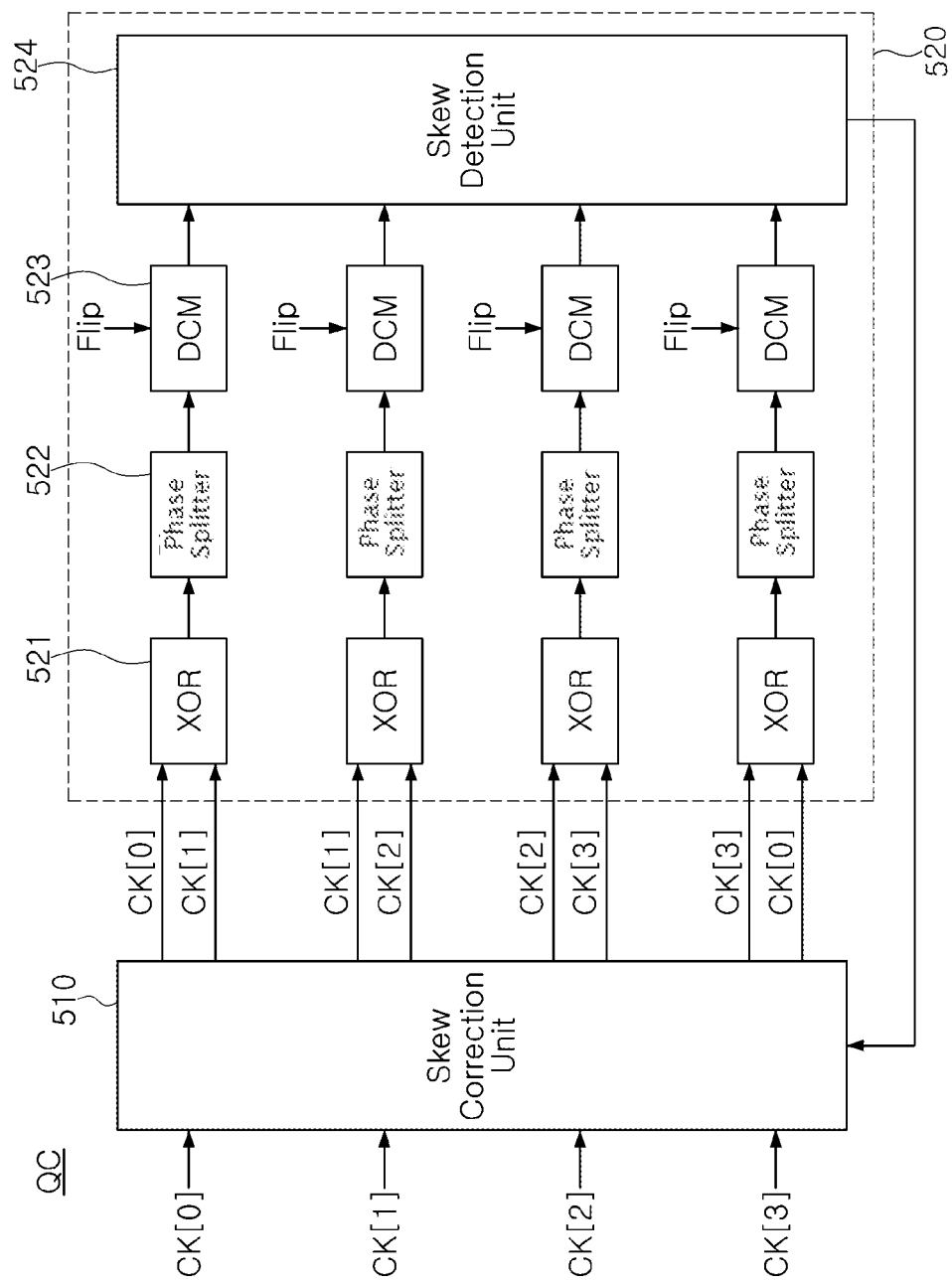
FIG. 5 is a diagram illustrating a quad skew corrector according to an example embodiment of the present inventive concept.

FIG. 5 is a view illustrating a quad skew corrector (QC) according to an example embodiment of the present inventive concept. Referring to FIG. 5, the quad skew corrector QC may include a skew correction unit 510.

The skew correction unit 510 may receive 4-phase clocks CK[0], CK[1], CK[2], and CK[3], adjust skew of each of the 4-phase clocks CK[0], CK[1], CK[2], and CK[3] according to a detection result value of a quad-skew monitor 520, and output the adjusted 4-phase clocks CK[0], CK[1], CK[2], and CK[3].

The quad skew monitor 520 may include an XOR circuit 521, a phase detector/splitter (i.e., separator) 522, a duty cycle monitor (DCM) 523, and a skew detection unit 524. The XOR circuit 521 may perform an XOR operation for two clocks (e.g., CK[0] and CK[1]) for skew detection among the 4-phase clocks CK[0], CK[1], CK[2], and CK[3]). The phase separator 522 may separate a phase from an output signal of the XOR circuit 521. The duty cycle monitor (DCM) 523 may detect a duty cycle from the output of the phase separator 522 in response to a flip. In an example embodiment, the duty cycle monitor 523 may include the circuit illustrated in FIG. 4A. The skew detection unit 524 may detect skew according to a result of the duty cycle monitor 523, and store skew information corresponding to the detected skew. Such skew information may be output to the skew correction unit 510.

Figure 6:
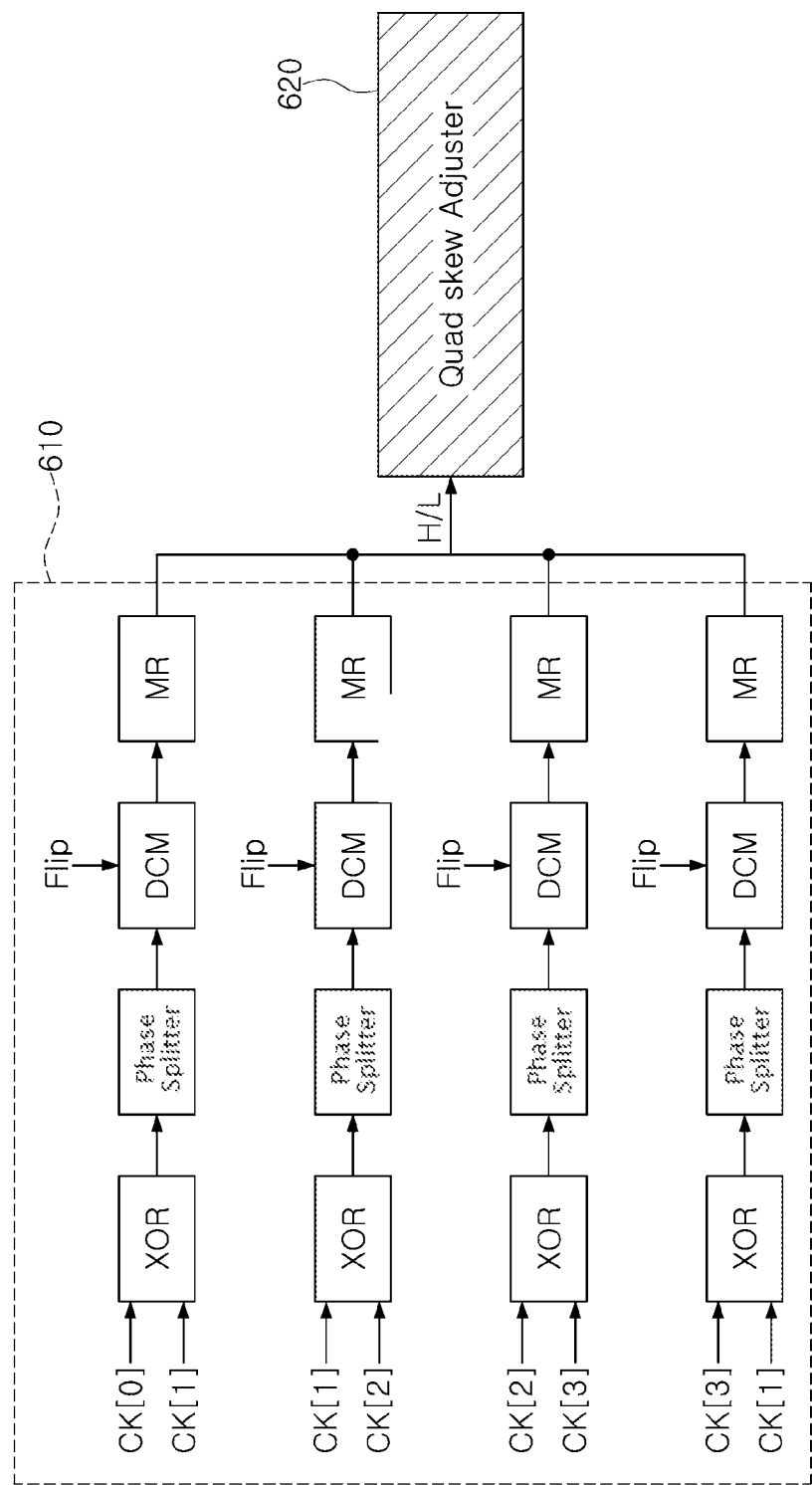
FIG. 6 is a diagram illustrating a quad skew adjuster according to an example embodiment of the present inventive concept.

FIG. 6 is a diagram illustrating a quad skew adjuster according to an example embodiment of the present inventive concept. Referring to FIG. 6, a quad skew adjuster 620 may adjust skew of the 4-phase clock by using duty information stored in a mode register MR of a memory device 610.

The mode register MR may store any one of high-level first duty information H and low-level second duty information L. Here, the first duty information H is a value indicating a duty ratio of 50% or more. In addition, the second duty information L is a value indicating a duty ratio of less than 50%.

The quad skew adjuster 620 may make a first period from rising of a first phase (x) to rising of a second phase (x+90) to be equal to or greater than a second period from rising of a second phase to falling of a first phase in response to the first duty information H output from the mode register MR. Here, the second phase may be a quadrature phase of the first phase.

In addition, the quad skew adjuster 620 may set a first period from rising of a first phase (x) to rising of a second phase (x+90) to be shorter than a second period from rising of a second phase to falling of a first phase, in response to the second duty information L from the mode register MR of the memory device 610.

Meanwhile, the quad skew adjuster 620 may adjust the skew of the 4-phase clock in various manners using the duty information output from the mode register MR of the memory device 610.

Figure 7:
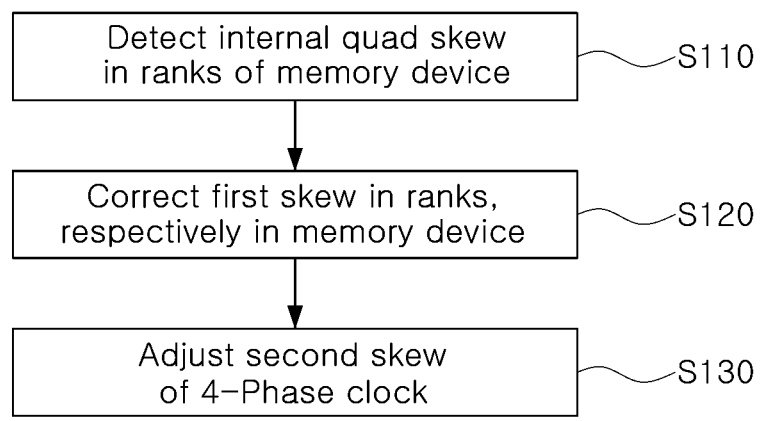
FIG. 7 is a flowchart illustrating a method of operating a memory system according to an example embodiment of the present inventive concept.

FIG. 7 is a flowchart illustrating an operating method of a memory system according to an example embodiment of the present inventive concept. Referring to FIGS. 1 to 7, an operation of the memory system 10 may proceed as follows.

Each of a plurality of ranks of the memory device 100 may receive a 4-phase clock CK[3:0] from the controller 200, and detect internal quad skew of the 4-phase clock CK[3:0](S110). In an example embodiment, the detected internal quad skew may be stored in respective mode registers of the ranks. The ranks may each correct first, internal skew of the 4-phase clock CK[3:0] according to the detected internal quad skew (S120). The controller 200 may read quad skew information stored in the mode register of the memory device 100, and adjust second skew of the 4-phase clock CK[3:0] in response to quad-skew information (S130).

In an example embodiment, skew directions of ranks may be determined through quad-skew detection. In an example embodiment, when (e.g., in response to determining that) the skew directions of the ranks are not the same, the quad skew detected in the ranks may be internally adjusted. In an example embodiment, when (e.g., in response to determining that) the skew directions of the ranks are the same, the controller 200 may receive mode register information from each of the ranks, and control the skew of the 4-phase clock by using the mode register information. Accordingly, adjustment of quad skew may be performed in response to the skew directions. In an example embodiment, the second channel may include a data pin or a command/address pin.

Figure 8:
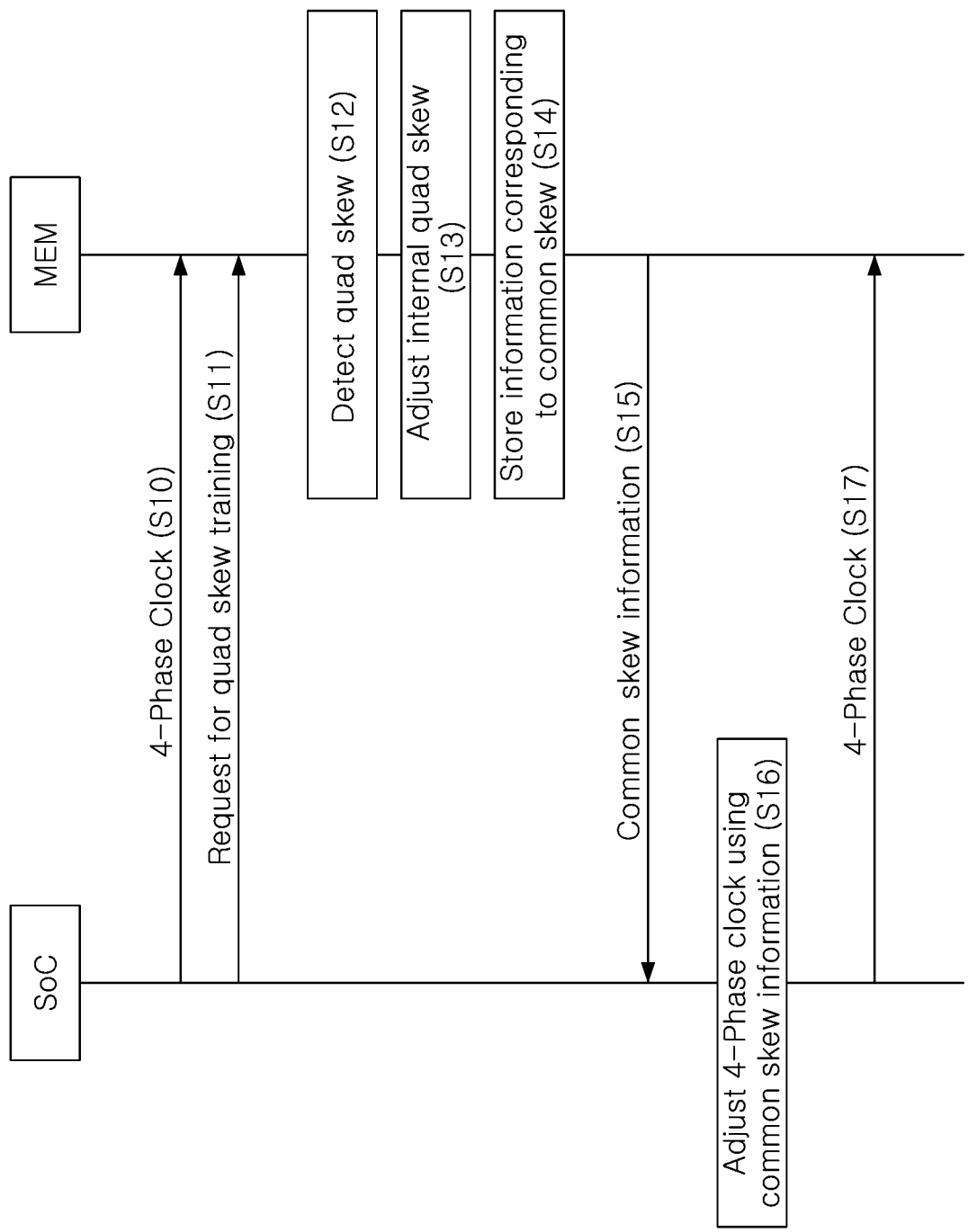
FIG. 8 is a ladder diagram illustrating a clock training process of a memory system according to an example embodiment of the present inventive concept.

FIG. 8 is a ladder diagram illustrating a clock training process of a memory system according to an example embodiment of the present inventive concept. Referring to FIGS. 1 to 8, a training process for a clock of the memory system may be performed as follows.

The control chip SoC, such as the controller 200 (FIG. 1), may transmit a 4-phase clock to the memory device MEM (S10), such as the memory device 100 (FIG. 1). The control chip SoC may request training for the 4-phase clock from the memory device MEM (S11). The memory device MEM may detect quad skew of the 4-phase clock in response to a training request for the 4-phase clock (S12). The memory device MEM may adjust internal quad skew according to the detected quad skew (S13). In this case, the memory device MEM may store information corresponding to common skew of the 4-phase clock (S14). The control chip SoC may read common skew information from the memory device MEM (S15). The control chip SoC may adjust the 4-phase clock using the common skew information (S16). The control chip SoC may output the adjusted 4-phase clock to the memory device MEM (S17).

Figure 9:
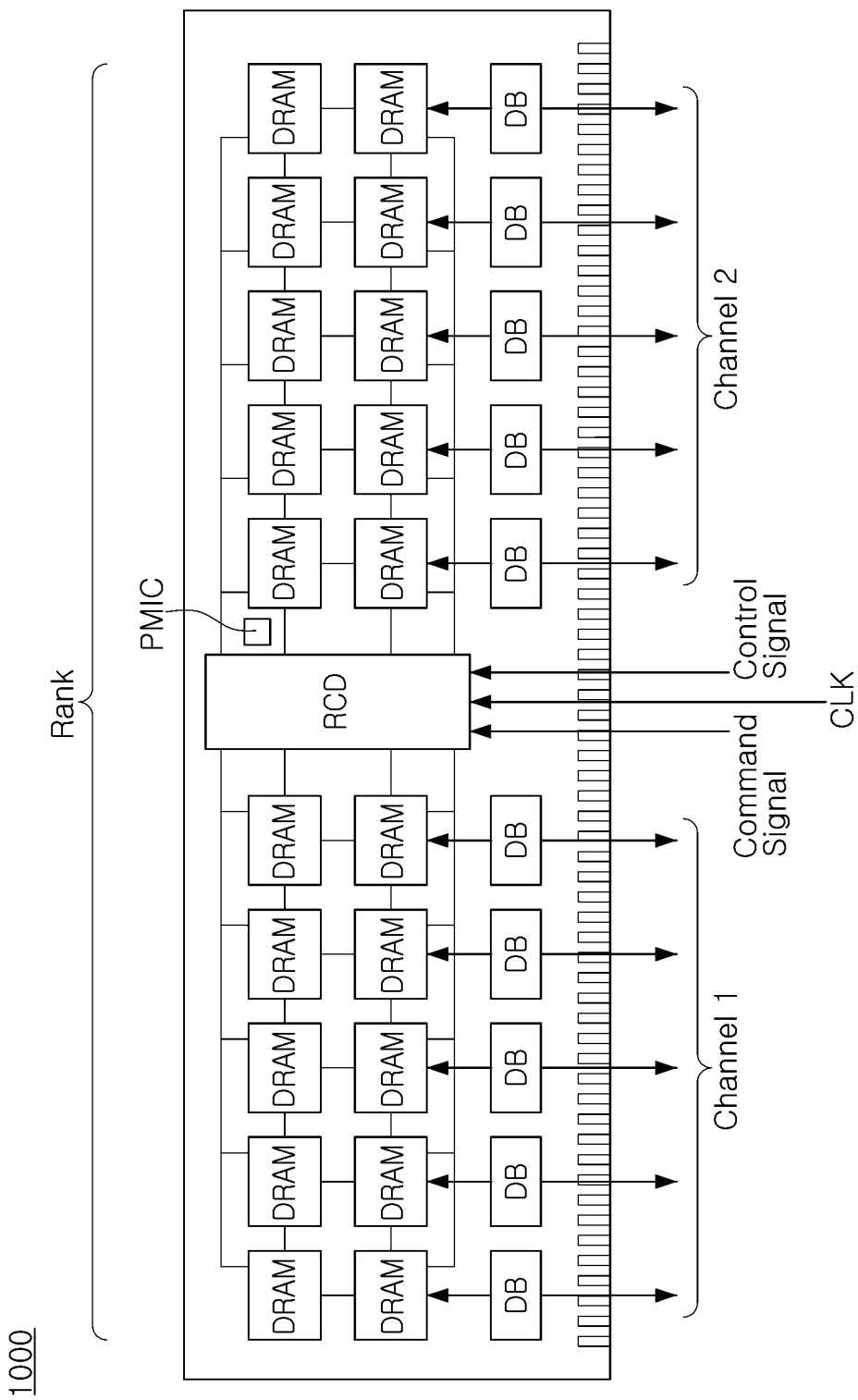
FIG. 9 is a diagram illustrating a memory module according to an example embodiment of the present inventive concept.

FIG. 9 is a diagram illustrating a memory module 1000 according to an example embodiment of the present inventive concept. Referring to FIG. 9, the memory module 1000 may include a plurality of memory chips (e.g., DRAMs) respectively including a memory cell array, and a buffer chip (RCD) for routing transmit/receive signals with the memory controller or managing memory operations for the memory chips, and a power management chip (PMIC). The RCD may control the memory chips and the PMIC under the control of the memory controller. For example, the RCD may receive a command signal, a control signal, and a clock signal from the memory controller.

The memory chips (e.g., pairs of the memory chips) may be respectively connected to a data buffer DB among a plurality of data buffers DB through a data transmission line to transmit and receive a data signal DQ (FIG. 2) and a data strobe signal. The memory chips are respectively connected to the data buffer DB through corresponding data transmission lines to transmit and receive parity data and a data strobe signal.

An SPD chip (not illustrated) may be a programmable read-only memory (EEPROM). The SPD chip may include initial information or device information of the memory module 1000. For example, the SPD chip may include initial information or device information such as a module type, module configuration, storage capacity, and execution environment of the memory module 500. When the memory system including the memory module 1000 is booted, the memory controller may read device information from the SPD chip and recognize the memory module based on the read device information.

The memory module 1000 may include a plurality of ranks. In an example embodiment, each of the plurality of ranks may include eight bank groups. Each of the bank groups may include four banks. In an example embodiment, the memory chips may be divided into first channel-only memory chips and second channel-only memory chips.

Meanwhile, each of the plurality of ranks may include a quad skew adjustment circuit receiving a 4-phase clock, detecting quad skew, storing information for the detected quad skew, and outputting the stored quad skew information.

Figure 10:
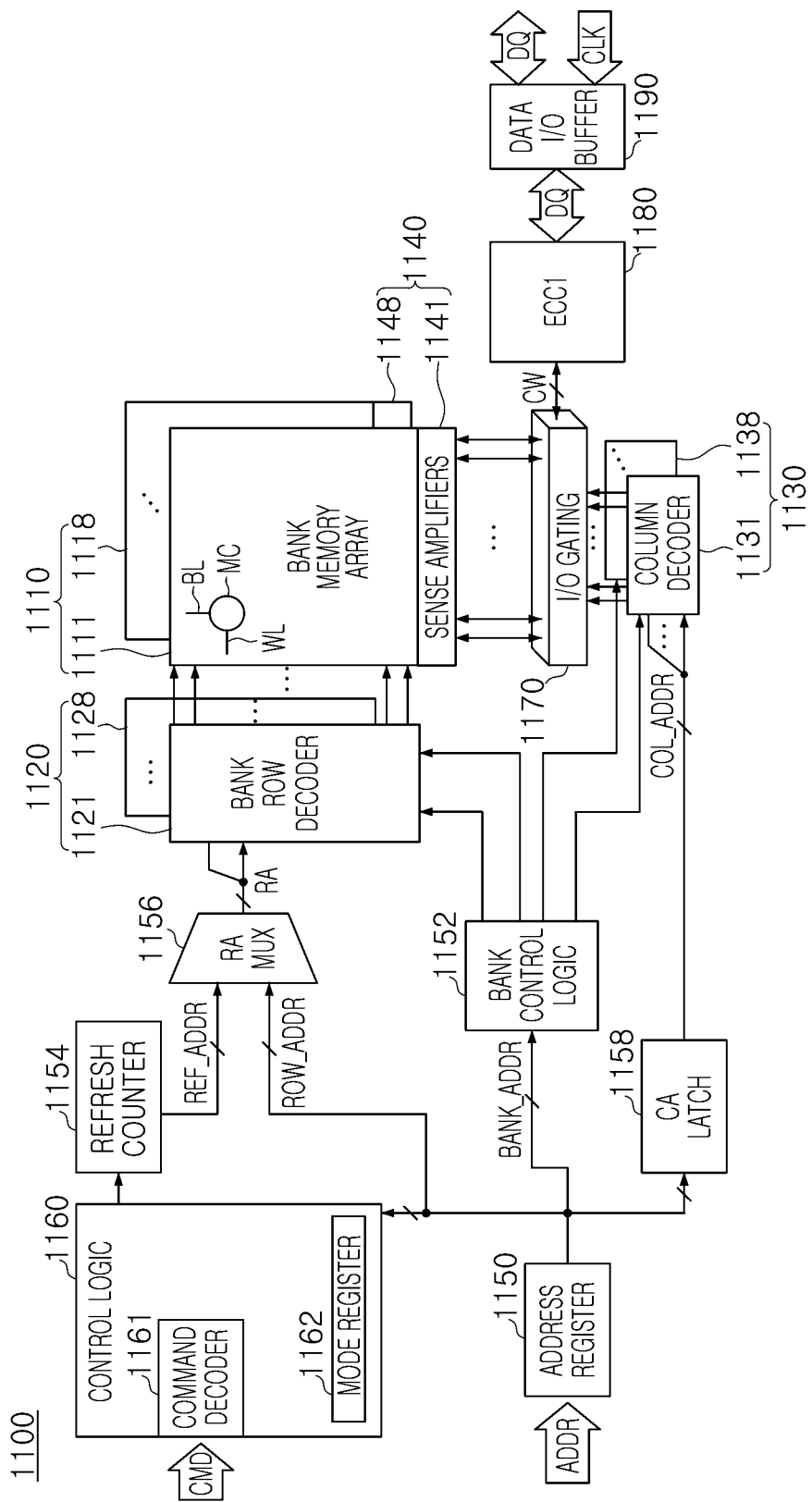
FIG. 10 is a diagram illustrating the memory device illustrated in FIG. 9.

FIG. 10 is a diagram illustrating the memory device 1100, which may comprise the memory module 1000 illustrated in FIG. 9. Referring to FIG. 10, the memory device 1100 may include a memory cell array 1110, a row decoder 1120, a column decoder 1130, a sense amplifier circuit 1140, an address register 1150, a bank control logic 1152, a refresh counter 1154, a row address multiplexer (RA MUX) 1156, a column address (CA) latch 1158, a control logic 1160, a repair control circuit, a timing control circuit, an input/output (I/O) gating circuit 1170, an error correction circuit (ECC1) 1180, and an input/output buffer 1190.

The memory cell array 1100 may include first to eighth banks 1111 to 1118. Meanwhile, it should be understood that the number of banks of the memory cell array 1100 is not limited thereto. Each of the first to eighth banks 1111 to 1118 may include a plurality of memory cells MCs connected between the word lines WLs and the bit lines BLs. Here, each of the plurality of memory cells may be implemented as a volatile memory cell or a non-volatile memory cell.

The row decoder 1120 may include first to eighth bank row decoders 1121 to 1128 respectively connected to the first to eighth banks 1111 to 1118. The column decoder 1130 may include first to eighth bank column decoders 1131 to 1138 respectively connected to the first to eighth banks 1111 to 1118. The sense amplifier circuit 1140 may include first to eighth sense amplifiers 1141 to 1148 respectively connected to the first to eighth banks 1111 to 1118.

Meanwhile, the first to eighth banks 1111 to 1118 may comprise first to eighth bank row decoders 1121 to 1128, first to eighth bank column decoders 1131 to 1138, and first to eighth bank sense amplifiers 1141 to 1148.

The address register 1150 may receive and store an address ADDR having a bank address BANK_ADDR, a row address ROW_ADDR, and a column address COL_ADDR from an external memory controller. The address register 1150 may provide the received bank address BANK_ADDR to the bank control logic 1152, provide the received row address ROW_ADDR to the row address multiplexer 1156, and provide the received column address COL_ADDR to the column address latch 1158.

The bank control logic 1152 may generate bank control signals in response to the bank address BANK_ADDR. A bank row decoder corresponding to the bank address BANK_ADDR among the first to eighth bank row decoders 1121 to 1128 may be activated in response to the bank control signals. A bank column decoder corresponding to the bank address BANK_ADDR among the first to eighth bank column decoders 1131 to 1138 may be activated in response to the bank control signals.

The row address multiplexer 1156 may receive a row address ROW_ADDR from the address register 1150, and receive a refresh row address REF_ADDR from the refresh counter 1154. The row address multiplexer 1156 may selectively output the row address ROW_ADDR or the refresh row address REF_ADDR as the row address RA. The row address RA output from the row address multiplexer 1156 may be applied to the first to eighth bank row decoders 1121 to 1128, respectively.

A bank row decoder activated by the bank control logic 1152 among the first to eighth bank row decoders 1121 to 1128 may decode the row address RA output from the row address multiplexer 1156 to activate a word line corresponding to the row address. For example, the activated bank row decoder may apply a word line driving voltage to a word line corresponding to a row address. In addition, the activated bank row decoder may activate the redundancy word line corresponding to the redundancy row address output from the repair control circuit at the same time as activating the word line corresponding to the row address.

The column address latch 1158 may receive the column address COL_ADDR from the address register 1150, and temporarily store the received column address COL_ADDR. In addition, the column address latch 1158 may gradually increase the received column address COL_ADDR in a burst mode. The column address latch 1158 may apply the temporarily stored or gradually increased column address COL_ADDR to the first to eighth bank column decoders 1131 to 1138, respectively.

A bank column decoder activated by the bank control logic 1152 among the first to eighth bank column decoders 1131 to 1138, may activate a sense amplifier corresponding to the bank address BANK_ADDR and the column address COL_ADDR through the input/output gating circuit 1170. In addition, the activated bank column decoder may perform a column repair operation in response to a column repair signal output from the repair control circuit.

The control logic 1160 may be implemented to control an operation of the memory device 1100. For example, the control logic 1160 may generate control signals so that the semiconductor memory device 1100 performs a write operation or a read operation. The control logic 1160 may include a command decoder 1161 for decoding a command CMD received from the memory controller and a mode register set 1162 for setting an operation mode of the memory device 1100. For example, the command decoder 1161 may generate operation control signals corresponding to a command CMD by decoding a write enable signal, a row address strobe signal, a column address strobe signal, a chip select signal, and the like. The control logic 1160 may provide the operation control signals to the timing control circuit. The control signals may include an active signal, a precharge signal, a write signal, and a read signal.

Each of input/output gating circuits of the input/output gating circuit 1170 may include an input data mask logic, read data latches for storing data output from the first to eighth banks 1111 to 1118, and write drivers for writing data to the first to eighth banks 1111 to 1118, together with circuits for gating input/output data. A code word CW to be read from one of the first to eighth banks 1111 to 1118 may be sensed by a sense amplifier corresponding to one bank and stored in read data latches. The code word CW stored in the read data latches may be provided to the memory controller through the input/output buffer 1190 after ECC decoding is performed by the error correction circuit 1180. Data DQ to be written to one of the first to eighth banks 1111 to 1118 may be written to one bank through write drivers after ECC encoding is performed by the error correction circuit 1180.

The error correction circuit 1180 (ECC1) may generate parity bits based on data bits of the data DQ provided from the input/output buffer 1190 in a write operation, and provide a code word including the data DQ and the parity bits to the input/output gating circuit 1170, and the input/output gating circuit 1170 may write the code word to the bank. In addition, the error correction circuit 1180 may receive the code word CW read from one bank from the input/output gating circuit 1170 in a read operation. The error correction circuit 1180 may correct at least one error bit included in data DQ by performing ECC decoding on the data DQ using parity bits included in the read code word CW to provide the same to the input/output buffer 1190.

The input/output buffer 1190 may provide data DQ to the error correction circuit 1180 based on the clock CLK provided from the memory controller in a write operation, and data DQ provided from the error correction circuit 1180 in a read operation may be provided to the memory controller.

Figure 11:
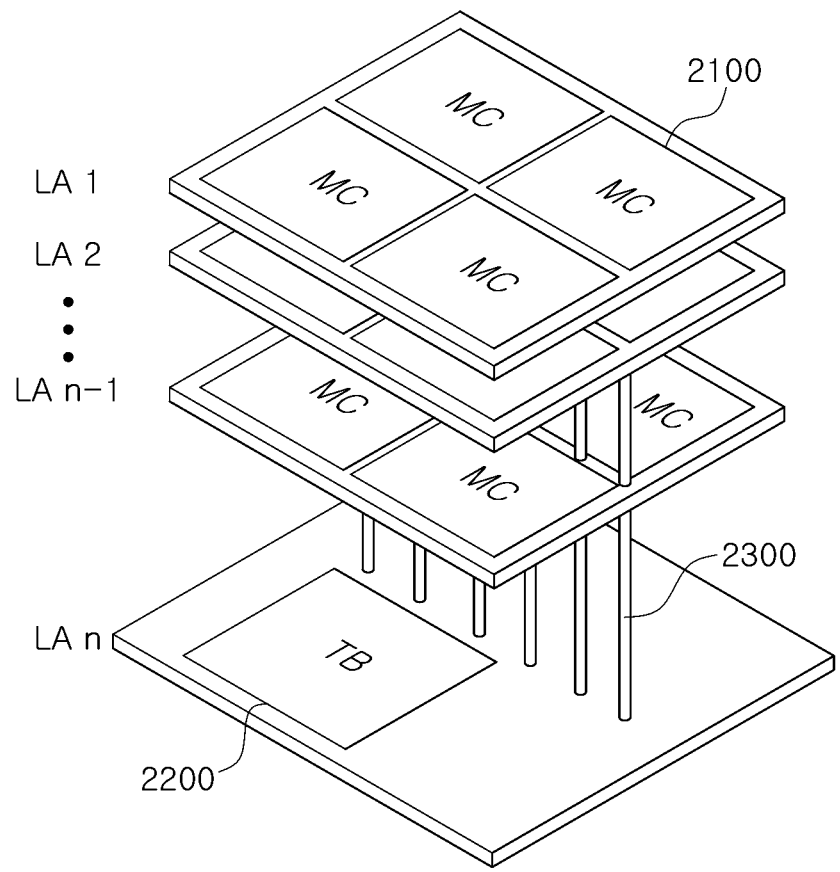
FIG. 11 is a diagram illustrating a semiconductor package of a stack structure including a plurality of layers according to an example embodiment of the present inventive concept.

FIG. 11 is a diagram illustrating a semiconductor package having a stack structure including a plurality of layers according to an example embodiment of the present inventive concept. Referring to FIG. 11, a semiconductor package 2000 may include a plurality of layers LA1 to LAn. Each of the first layer LA1 to the n−1 layer LAn−1 may be a memory layer (or, a memory chip) including a plurality of memory cores MC. The memory core MC may include a memory cell array, a row decoder, a column decoder, a sense amplification circuit, and an error correction circuit.

The n-th layer LAn may be a buffer layer (or a buffer chip). In the semiconductor package 2000, the layers LA1 to LAn of the stack structure may be interconnected through a through silicon via (TSV) 2300. The buffer layer LAn may communicate with an external memory controller and the memory layers LA1 to LAn−1, and may route transmission/reception signals between the memory layers LA1 to LAn−1 and the memory controller. Furthermore, the buffer layer LAn may queue signals received from the memory controller or the memory layers LA1 to LAn−1. In addition, the buffer layer LAn may include a training block 2200. The buffer layer LAn may perform a training operation on the memory layers LA1 to LAn−1 by using the training block 2200. The training block 2200 may include a quad skew adjustment circuit receiving a 4-phase clock, detecting quad skew, and outputting mode register information to internally adjust first quad skew, and externally adjust second quad skew, as described in FIGS. 1 to 8.

Figure 12:
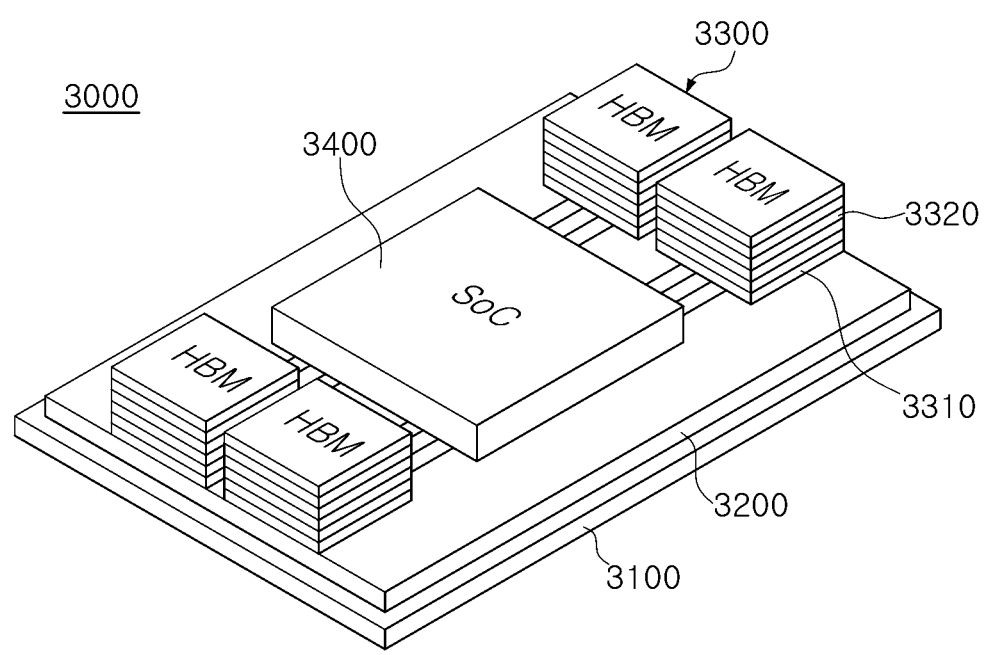
FIG. 12 is a diagram illustrating a semiconductor package including a stack semiconductor chip according to an example embodiment of the present inventive concept.

FIG. 12 is a diagram illustrating a semiconductor package according to an example embodiment of the present inventive concept. Referring to FIG. 12, a semiconductor package 3000 may be a memory module including at least one semiconductor chip stack 3300 such as printed circuit board and a system-on-chip (SOC) 3400 mounted on a package substrate 3100. An interposer 3200 may optionally be further provided. The semiconductor chip stack 3300 may be formed of Chip-on-Chip (CoC). The semiconductor chip stack 3300 may include a quad skew adjustment circuit receiving a 4-phase clock, detecting quad skew, and outputting mode register information to internally adjust first quad skew, and externally adjust second quad skew, as described in FIGS. 1 to 8.

The semiconductor chip stack 3300 may include at least one memory chip 3320 stacked on a buffer chip 3310 such as a logic chip. The buffer chip 3310 and the at least one memory chip 3320 may be connected to each other by a through silicon via (TSV). The buffer chip 3310 may perform a training operation on the memory chip 3320. The semiconductor chip stack 3300 may be, for example, a high bandwidth memory (HBM) of 500 GB/sec to 1 TB/sec or more.

The semiconductor device according to an example embodiment of the present inventive concept may have an interface for transmitting and receiving a 4-phase clock through input/output pins, detect quad skew of the 4-phase clock, and compensate for skew of the clock internally according to the result, or may compensate for skew of the clock externally, so that it is possible to secure a higher/maximum timing margin in a system using a 4-phase clock.

The memory system according to an example embodiment of the present inventive concept is a system for transmitting and receiving data in synchronization with a 4-phase clock, and may include a semiconductor device outputting a clock and a semiconductor device receiving the clock. In an example embodiment, the semiconductor device receiving the clock may include a circuit for detecting or monitoring quad skew of a 4-phase clock. In an example embodiment, a result of detecting of the skew of the clock may be fed back to the semiconductor device outputting the clock, or the semiconductor device receiving the clock internally may compensate for the skew so that errors according to the skew of the 4-phase clock skew may be reduced/minimized in the semiconductor device. Accordingly, in the present inventive concept, by reducing/minimizing the quad skew of the 4-phase clock, it is possible to increase/maximize a timing margin of the circuit for transmitting and receiving data.

In a general memory system, in a system transmitting and receiving data using a 4-phase clock, a problem such as a decrease in a timing margin of a circuit transmitting and receiving data, for example, a data sampling circuit, may occur due to skew between clocks. The memory system according to an example embodiment of the present inventive concept may greatly/maximally secure the timing margin of data, by correcting a skew error between 4-phase clocks having different phases in a semiconductor device receiving the clock or a semiconductor device transmitting the clock.

In the memory device according to an example embodiment of the present inventive concept, internal quad skew may be detected in a multi-rank system transmitting and receiving a 4-phase clock to and from an I/O pin. In an example embodiment, the memory device may have a circuit for compensating for quad skew within a memory device of an individual rank by using output information corresponding to the detected quad skew. In an example embodiment, the memory system may use output information to send the same externally through a memory device I/O pin, and use the information, so that the common quad skew of multiple ranks can be adjusted.

Meanwhile, the quad-skew control of the 4-phase clock has been described with reference to FIGS. 1 to 12. However, the present inventive concept needs not be limited thereto. In the present inventive concept, in a semiconductor device having an interface for transmitting and receiving a 4-phase clock through input/output pins, a duty of the 4-phase clock may be detected, a duty (e.g., duty cycle) error may be compensated internally according to the result thereof, or a duty error may be compensated by monitoring the clock externally, so that it is possible to reduce/minimize the duty error in the 4-phase clock.

A multi-rank system according to an example embodiment of the present inventive concept may include a semiconductor device capable of both externally and internally adjusting skew/duty error between 4-phase clocks.

As set forth above, in a memory device, and a memory system including the same, and an operating method thereof according to an example embodiment of the present inventive concept, quad skew may be detected from the memory device, and the detected quad skew may be efficiently removed internally and externally of the memory device.

Advantages and effects of the present inventive concept are not limited to the above description.

While example embodiments have been shown and described above, it will be apparent to those skilled in the art that modifications and variations could be made without departing from the scope of the present disclosure, as defined by the appended claims.

What is claimed is:

1. A memory device comprising:
   a first rank having first memory banks and a first quad skew adjustment circuit; and
   a second rank having second memory banks and a second quad skew adjustment circuit,
   wherein each of the first quad skew adjustment circuit and the second quad skew adjustment circuit is configured to:
   receive a 4-phase clock through first channels;
   detect internal quad skew of the 4-phase clock;
   correct skew of the 4-phase clock according to the detected quad skew; and output mode register information corresponding to the detected quad skew through a second channel.

2. The memory device of claim 1, wherein quad skew common to the first rank and the second rank sharing the 4-phase clock is removed by an external device using the mode register information.

3. The memory device of claim 1, wherein quad skew is adjusted in response to a skew direction of the first rank and a skew direction of the second rank.

4. The memory device of claim 3, wherein quad skew is removed by an external device using the mode register information when the skew direction of the first rank and the skew direction of the second rank are the same.

5. The memory device of claim 3, wherein quad skew common to the first rank and the second rank sharing the 4-phase clock is removed by an external device using the mode register information when the skew direction of the first rank and the skew direction of the second rank are not the same.

6. The memory device of claim 5, wherein the first and second quad skew adjustment circuits are configured to remove additional quad skew other than the quad skew common to the first rank and the second rank.

7. The memory device of claim 1, wherein each of the first quad skew adjustment circuit and the second quad skew adjustment circuit comprises:
a clock receiver configured to receive the 4-phase clock through the first channels;
a quad skew monitor configured to detect quad skew of the 4-phase clock output from the clock receiver;
a quad skew corrector configured to adjust skew of the 4-phase clock according to the detected quad skew; and
a mode register configured to store the mode register information corresponding to the detected quad skew.

8. The memory device of claim 7, wherein the quad skew monitor is configured to:
group the 4-phase clock by two phases;
generate clocks having opposite phases having a frequency twice a frequency of the 4-phase clock using edge-to-edge processing;
accumulate a duty cycle through a charge pump by receiving the clocks;
determine a duty cycle of each of the clocks by comparing the accumulated duty cycle; and
detect a skew between the corresponding phase clocks by using the duty cycle.

9. The memory device of claim 7, wherein the quad skew corrector comprises:
a logic circuit configured to receive a first phase clock and a second phase clock among the 4-phase clock, and to perform an XOR operation on the first phase clock and the second phase clock;
a phase separator configured to separate phases of an output signal of the logic circuit;
a duty cycle monitor configured to detect a duty cycle corresponding to the first phase clock and the second phase clock from the output signal of the phase separator; and
a skew detection unit configured to detect skew between the first phase clock and the second phase clock in response to an output value of the duty cycle monitor.

10. The memory device of claim 9, wherein the quad skew corrector further comprises a skew correction unit configured to correct the skew of the first phase clock and the second phase clock by using the skew detected by the skew detection unit, the second phase clock being a quadrature phase of the first phase clock.

11. An operating method of a system including a multi-rank memory device and a controller configured to control the multi-rank memory device, the operating method comprising:
detecting internal quad skew of a 4-phase clock received through first channels from the controller by a plurality of ranks of the multi-rank memory device;
correcting, by the ranks, first skew of the 4-phase clock according to the detected internal quad skew; and
adjusting, by the controller, second skew of the 4-phase clock using mode register information that corresponds to the internal quad skew and is received through a second channel from the ranks by the controller.

12. The operating method of claim 11, wherein the detecting the internal quad skew comprises:
determining skew directions of the ranks.

13. The operating method of claim 11, wherein the correcting the first skew comprises:
adjusting, by the ranks, the detected quad skew in response to determining that skew directions of the ranks are not the same.

14. The operating method of claim 11, wherein the correcting the second skew comprises:
receiving the mode register information from the ranks by the controller in response to determining that skew directions of the ranks are the same; and
controlling, by the controller, the skew of the 4-phase clock using the mode register information.

15. The operating method of claim 11, wherein the second channel comprises a data pin or a command/address pin.

16. A memory system comprising:
a memory device configured to adjust first quad skew of a 4-phase clock; and
a controller configured to control the memory device, and to control second quad skew of the 4-phase clock,
wherein the memory device includes:
a first rank configured to receive the 4-phase clock from the controller through first channels, to detect first internal quad skew of the 4-phase clock, to store first mode register information corresponding to the first internal quad skew, and to output the first mode register information to the controller through a second channel; and
a second rank configured to receive the 4-phase clock through the first channels, to detect second internal quad skew of the 4-phase clock, to store second mode register information corresponding to the second internal quad skew, and to output the second mode register information to the controller through the second channel.

17. The memory system of claim 16, wherein the controller comprises a quad-skew controller that includes:
a clock transmitter configured to output the 4-phase clock through the first channels; and
a quad-skew adjuster configured to control the 4-phase clock by using the first mode register information or the second mode register information.

18. The memory system of claim 17, wherein the first mode register information and the second mode register information comprise duty cycle information corresponding to skew between a first phase clock and a second phase clock among the 4-phase clock.

19. The memory system of claim 18, wherein the quad-skew adjuster is configured to adjust a first period from rising of the first phase clock to rising of the second phase clock to be equal to or longer than a second period from the rising of the second phase clock to falling of the first phase clock, when the duty cycle information indicates 50% or more.

20. The memory system of claim 18, wherein the quad-skew adjuster adjusts a first period from rising of the first phase clock to rising of the second phase clock to be shorter than a second period from the rising of the second phase clock to the falling of the first phase clock, when the duty cycle information indicates less than 50%.

* * * * *